(12) United States Patent
Wen et al.

(10) Patent No.: US 7,754,511 B2
(45) Date of Patent: Jul. 13, 2010

(54) LASER LIFT-OFF METHOD

(75) Inventors: Wei-Chih Wen, Hsinchu (TW);
Liang-Jyi Yan, Taipei County (TW);
Chih-Sung Chang, Hsinchu (TW)

(73) Assignee: High Power Opto. Inc., Taichung County (TW)

( * ) Notice: Subject to any disclaimer, the term of this patent is extended or adjusted under 35 U.S.C. 154(b) by 0 days.

(21) Appl. No.: 12/169,317

(22) Filed: Jul. 8, 2008

(65) Prior Publication Data
US 2010/0009515 A1   Jan. 14, 2010

(51) Int. Cl.
*H01L 21/00* (2006.01)
(52) U.S. Cl. .................... 438/33; 438/42; 438/458; 438/460; 438/462; 438/463; 438/464
(58) Field of Classification Search .............. None
See application file for complete search history.

(56) References Cited

U.S. PATENT DOCUMENTS

| | | | |
|---|---|---|---|
| 6,617,261 B2 * | 9/2003 | Wong et al. | 438/778 |
| 6,746,889 B1 * | 6/2004 | Eliashevich et al. | 438/33 |
| 7,202,141 B2 * | 4/2007 | Park et al. | 438/458 |
| 7,241,667 B2 * | 7/2007 | Park et al. | 438/458 |
| 7,294,521 B2 * | 11/2007 | Yoo | 438/46 |
| 7,563,629 B2 * | 7/2009 | Lee et al. | 438/34 |
| 2009/0029499 A1 * | 1/2009 | Nakahara | 438/46 |

\* cited by examiner

*Primary Examiner*—Kiesha R Bryant
*Assistant Examiner*—Khanh B Duong
(74) *Attorney, Agent, or Firm*—Muncy, Geissler, Olds, & Lowe, PLLC

(57) ABSTRACT

The present invention discloses a laser lift-off method, which applies to lift off a transient substrate from an epitaxial layer grown on the transient substrate after a support substrate having an adhesion metal layer is bonded to the epitaxial layer. Firstly, the epitaxial layer is etched to define separation channels around each chip section, and the epitaxial layer between two separation channels is not etched but preserved to form a separation zone. Each laser illumination area only covers one illuminated chip section, the separation channels surrounding the illuminated chip section, and the separation zones surrounding the illuminated chip section. Thus, the adhesion metal layer on the separation channels is only heated once. Further, the outward stress generated by the illuminated chip section is counterbalanced by the outward stress generated by the illuminated separation zones, and the stress-induced structural damage on the chip section is reduced.

3 Claims, 4 Drawing Sheets

LASER LIFT-OFF METHOD

FIELD OF THE INVENTION

The present invention relates to a laser lift-off method, particularly to a laser lift-off method for an epitaxial layer of LED chip.

BACKGROUND OF THE INVENTION

The LED (Light Emitting Diode) chip is a primary component of a light emitting diode and is formed via successively epitaxially growing semiconductor light emitting materials. A LED chip is made of a semiconductor material, such as GaP (Gallium Phosphide), GaAlAs (Gallium Aluminum Arsenide), GaAs (Gallium Arsenide), or GaN (Gallium Nitride), which has a PN junction thereinside and a unidirectional conductivity.

For example, in fabricating a blue light LED, a high-quality GaN-based epitaxial film is grown on a sapphire ($Al_2O_3$) substrate. However, the sapphire substrate has poor electric and thermal conductivities. Thus, positive and negative electrodes have to be arranged in the same side in the conventional blue light LED, which decreases the light emitting area. Further, the current crowding effect thereof raises the forward resistance and the forward voltage drop.

To solve the above-mentioned problems, the current solution is to form a new substrate on the GaN-based epitaxial film that has been grown on the sapphire substrate via electroplating a metal film on the GaN-based film or bonding a wafer to the metal film. Then, the sapphire substrate is removed with a laser lift-off method. Thus, the GaN-based epitaxial film adheres to the new substrate via metal bonding. The high thermal conductivity and high electric conductivity of the new substrate makes LED more adaptive to high current applications and solves the heat-dissipation problem occurring in a high luminous flux situation.

Refer to FIG. 1. In a conventional laser lift-off method, an epitaxial layer 20 is grown on a transient substrate 10 (such as a sapphire substrate) firstly; next, separation channels 22 are formed in the epitaxial layer 20 with an etching method to define a plurality of chip sections 21; next, a support substrate 40 having an adhesion metal layer 30 is bonded to the epitaxial layer 20; next, a photomask (not shown in the drawing) with hollowed-out regions (of a circular shape, a rectangular shape, or another shape) is placed near the transient substrate 10, and a laser light 50 passes through the hollowed-out regions of the photomask to illuminate the transient substrate 10. Refer to FIG. 2. Each laser illumination area 51 of the laser light 50 includes a chip section 21 corresponding to one hollowed-out region and the separation channels 22 around the chip section 21. After the laser light 50 carpet-scans and heats the entire transient substrate 10, the transient substrate 10 is lifted off from the epitaxial layer 20. At this time, the chip sections 21 of the epitaxial layer 20 are bonded to the support substrate 40 via the adhesion metal layer 30.

Refer to FIG. 3. When the transient substrate 10 having the epitaxial layer 20 is boned to the support substrate 40, there are bonding-induced warpages appearing in the perimeter thereof, and the warpages will cause alignment problem. When the laser light 50 projects through the hollowed-out regions to illuminate the transient substrate 10, the laser illumination areas 51 for the chip sections 21 in the perimeter are apt to shift toward the center. Even though the hollowed-out regions have been precisely defined in the photomask, the separation channels 22 between neighboring chip sections 21 in the perimeter of the transient substrate 10 still will be illuminated and heated twice when the laser light 50 carpet-scans the entire transient substrate 10. Thus, the adhesion metal layer 30 on the above-mentioned separation channel is also heated twice, which will results in high temperature and damage the adhesion metal layer 30. The current solution is widening the separation channels 22 to prevent the adhesion metal layer 30 of the separation channel 22 from being heated twice.

Refer to FIG. 4. When the laser light 50 illuminates each chip section 21, the outward stress of the chip section 21 will affect the neighboring chip sections 21. When the laser light 50 carpet-scans the entire transient substrate 10, each chip section 21 of the epitaxial layer 20 may be illuminated by the laser light 50 several times, and the induced stress F1 may damage the structure of LED.

SUMMARY OF THE INVENTION

The primary objective of the present invention is to promote the yield of LED chips via solving the problem that the adhesion metal layer on the separation channel is damaged by double heating.

Another objective of the present invention is to promote the yield of LED chips via solving the problem that the stress generated by each illuminated chip section affecting the neighboring chips and preventing the epitaxial layer from being damaged by stress.

The present invention proposes a scheme using a separation zone to solve the above-mentioned problems: firstly, an epitaxial layer is grown on a transient substrate; next, the epitaxial layer is etched to form a separation channel around each chip section, and an unetched separation zone is formed between two neighboring separation channels, wherein the spacing of two chip sections is defined by two neighboring separation channels and the separation zone therebetween, and wherein the separation channel has a width between 1 and 10 nm, and the separation zone has a width between 10 and 100 nm.

After a support substrate is bonded to the epitaxial layer with the adhesion metal layer, a laser light is used to carpet-scan and heat the entire transient substrate and lift off the transient substrate from the epitaxial layer. When the laser light passes through the hollowed-out regions to illuminate transient substrate, the laser light will only illuminate the separation zone and the separation channel beside the chip section. Thus, even in the perimeter of the transient substrate, only the separation zone beside the illuminated chip section is illuminated twice, and the separation channels beside each chip section are only illuminated once. In other words, the adhesion metal layer of the separation channel is only heated once.

Further, when the laser light illuminates one chip section, it also illuminates the separation zones around the chip section. Thus, the outward stress generated by the illuminated chip section is counterbalanced by stress generated by the surrounding separation zones, which can reduce the stress-induced structural damage of the chip sections in the epitaxial layer.

The present invention has an advantage that the adhesion metal layer on the separation channels is only heated once, wherein each laser illumination only covers the separation zones and the separation channels beside the related chip section. Thus, the separation channels beside each chip section have only one chance to be illuminated by the laser light, and the adhesion metal layer on the separation channels has only one chance to be heated. Thereby, the damage of the adhesion metal layer and LED structure is reduced.

Further, when the laser light illuminates each chip section, the outward stress generated by the illuminated chip section is counterbalanced by the outward stress generated by the illuminated separation zones beside the illuminated chip section. Thus, the stress-induced structural damage of each chip section in the epitaxial layer is reduced.

DETAILED DESCRIPTION OF THE PREFERRED EMBODIMENTS

Below, the technical contents of the present invention are described in detail with the embodiments. However, it should be understood that the embodiments are only to exemplify the present invention but not to limit the scope of the present invention.

Figure 1:
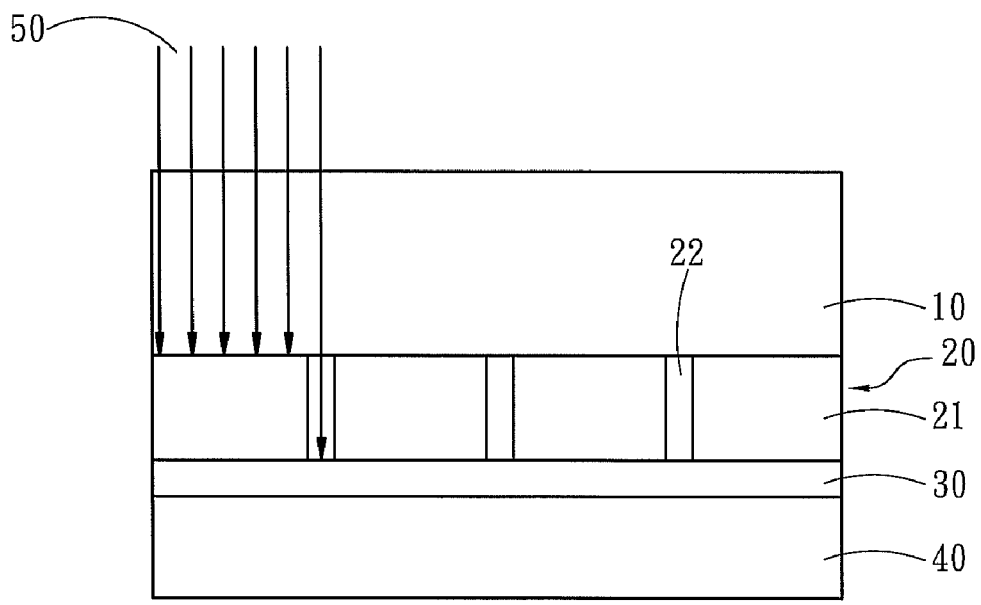
FIG. 1 is a diagram schematically showing a conventional laser lift-off method.
Figure 2:
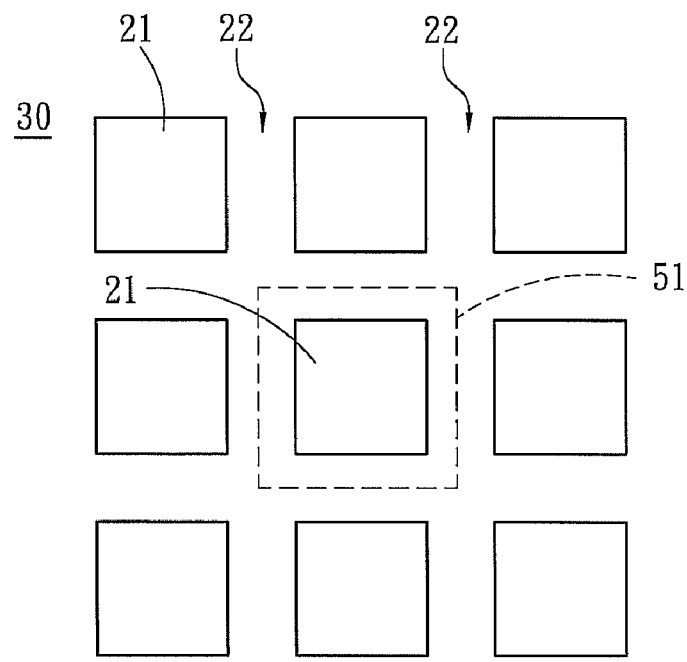
FIG. 2 is a diagram schematically showing a laser illumination area and a chip section in a conventional laser lift-off method.
Figure 3:
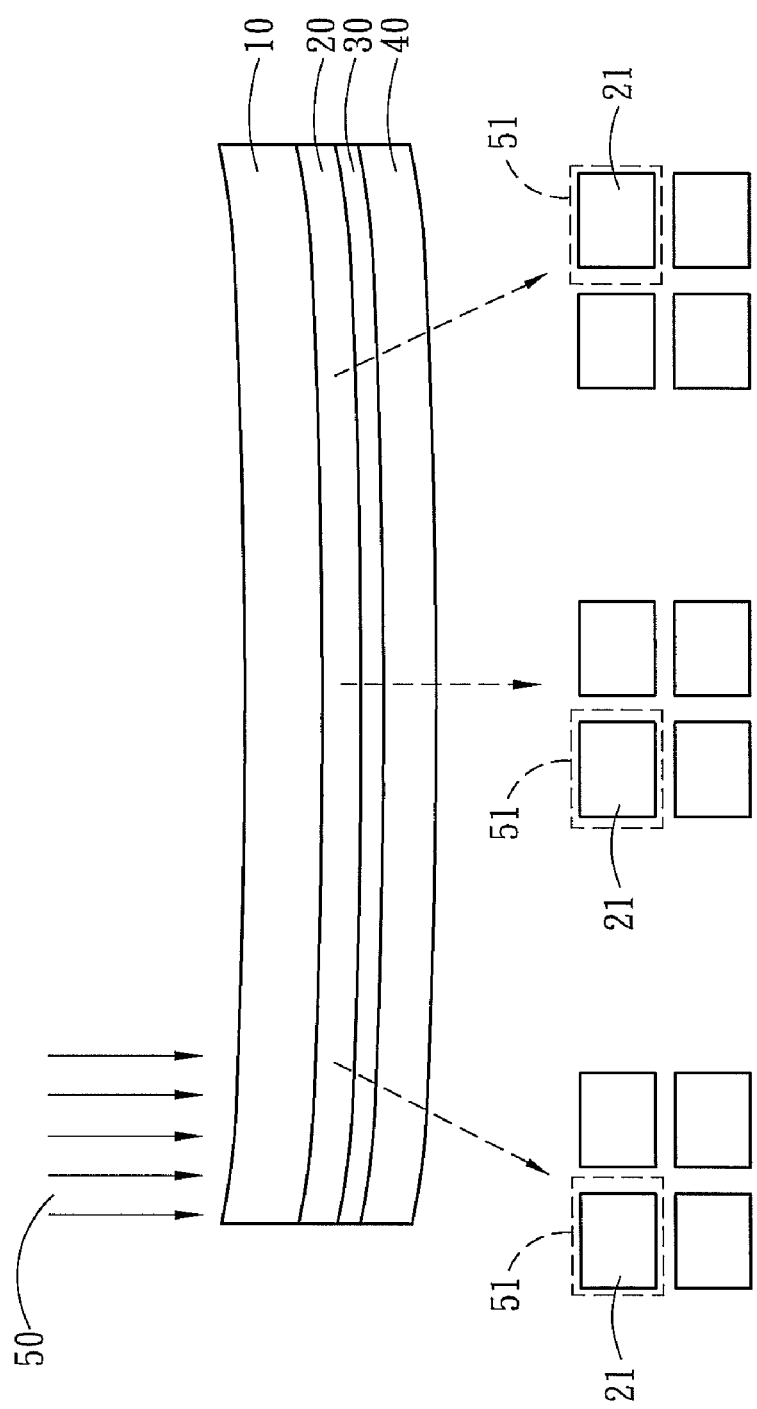
FIG. 3 is a diagram schematically showing the relative positions of the laser illumination areas and the chip sections in different locations of the transient substrate in a conventional laser lift-off method.
Figure 4:
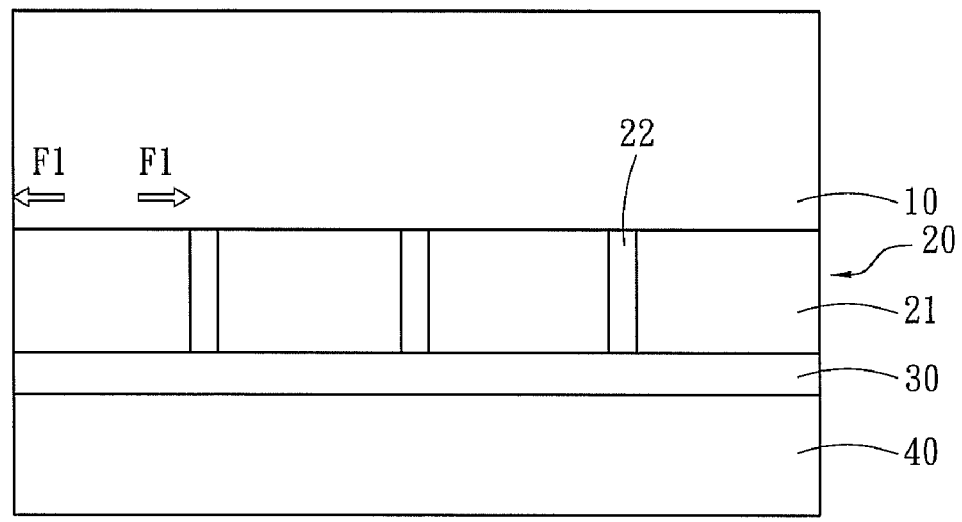
FIG. 4 is a diagram schematically showing the stress generated by the chip section illuminated by a laser light in a conventional laser lift-off method.
Figure 5:
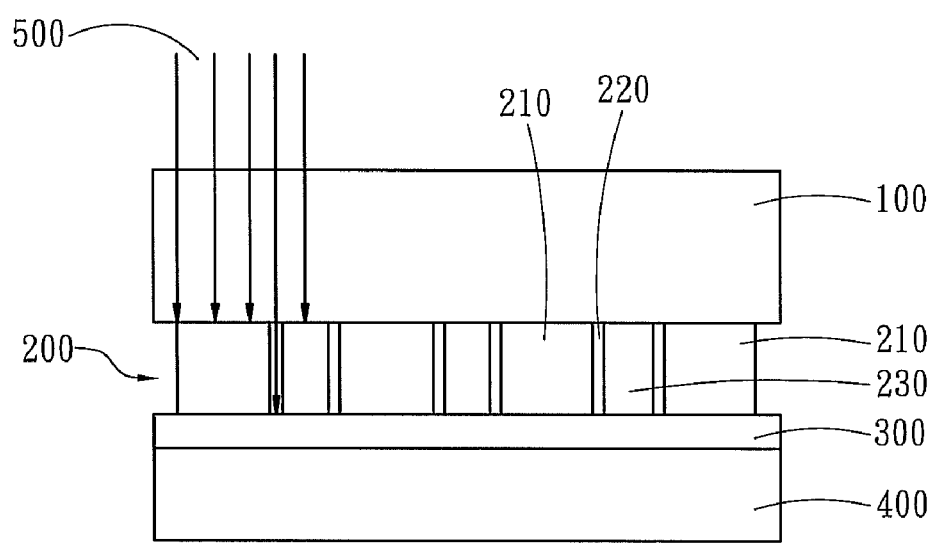
FIG. 5 is a diagram schematically showing a laser lift-off method according to the present invention.

Refer to FIG. 5. The present invention applies to the existing laser lift-off method. Firstly, a light emitting epitaxial layer 200 is grown on a transient substrate 100 (such as a sapphire substrate). Next, the epitaxial layer 200 is etched to define separation channels 220 around the perimeter of each chip section 210. Distinct from the conventional laser lift-off method, the epitaxial layer 200 between two separation channels 220 is not etched but preserved to form a separation zone 230. Thus, the spacing between two neighboring chip sections 210 is defined by two separation channels 220 and the separation zone 230 therebetween. In practical application, the separation zone 230 is wider than the separation channel 220; the separation channel 220 has a width between 1 and 10 nm, and the separation zone 230 has a width between 10 and 100 nm.

Next, a support substrate 400 having an adhesion metal layer 300 is bonded to the epitaxial layer 200.

Next, a photomask (not shown in the drawing) with hollowed-out regions (of a circular shape, a rectangular shape, or another shape) is placed near the transient substrate 100, and a laser light 500 passes through the hollowed-out regions of the photomask to illuminate the transient substrate 100. After the laser light 500 carpet-scans and heats the entire transient substrate 100, the transient substrate 100 is lifted off from the epitaxial layer 200. At this time, the chip sections 210 of the epitaxial layer 200 are bonded to the support substrate 400 via the adhesion metal layer 300.

Figure 6:
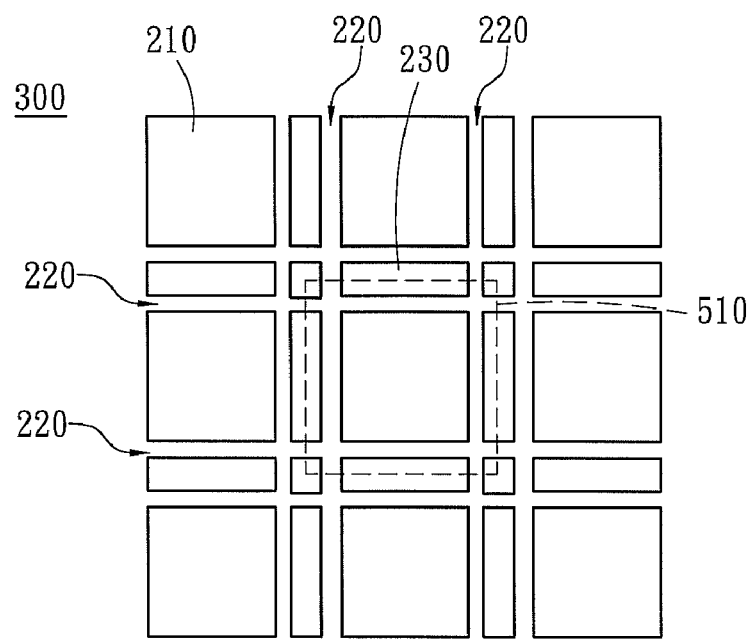
FIG. 6 is a diagram schematically showing the relative position of the laser illumination area and the chip section according to the present invention.

Refer to FIG. 6, wherein the hollowed-out region is exemplified by a rectangle. In each illumination of the laser light 500, a laser illumination area 510 corresponding to a hollowed-out region above a chip section 210 covers only the illuminated chip section 210, the separation channels 220 around the illuminated chip section 210, and the separation zones 230 beside the above-mentioned separation channels 220; the separation channels 220 in the other sides of the above-mentioned separation zones 230 are not illuminated by the laser light 500. The bonding of the transient substrate 100 and the support substrate 400 is apt to induce warpages in the perimeter thereof. In the conventional laser lift-off method, the laser light 500 is likely to illuminate the separation channels 220 twice in the peripheral warped areas. However, in the present invention, only the separation zones 230 beside the chip sections 210 in the peripheral warped areas are illuminated twice when the laser light 500 passes through the hollowed-out regions to illuminate the transient substrate 100. In the present invention, the separation channels 220 in the peripheral warped areas have only one chance to be illuminated by the laser light 500. In other words, the adhesion metal layer 300 on the separation channels 220 is only heated once. Even though the laser illumination areas 510 of the chip sections 210 in the perimeter are apt to shift toward the center, the present invention can prevent the separation channels 220 from being twice illuminated. Thus, the laser-induced damage on the adhesion metal layer 300 is reduced.

The twice-illuminated separation zones 230 will not be used anymore in the succeeding process and will be removed with a dry etching method after the transient substrate 100 is lifted off.

Figure 7:
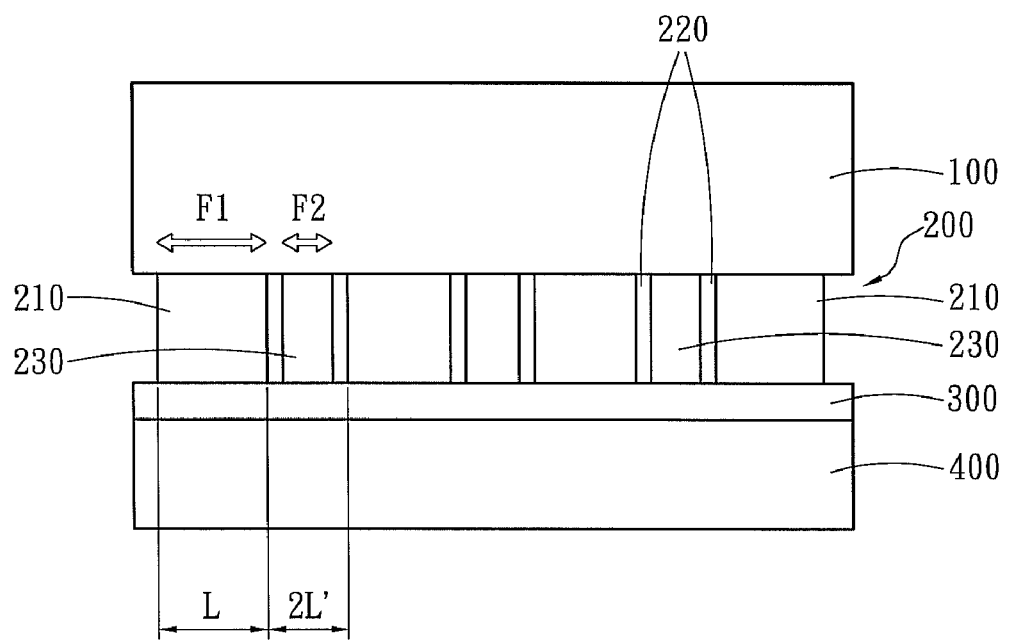
FIG. 7 is a diagram schematically showing the stresses when the chip section is illuminated by a laser light according to the present invention.

Refer to FIG. 7. When the laser light 500 illuminates the chip sections 210, they generate outward stress F1. In the present invention, the laser light 500 also illuminates the separation zones 230 surrounding one illuminated chip section 210. Thus, the outward stress F1 generated by the chip section 210 is counterbalanced by a stress F2 generated by the separation zones 230. Thereby, the stress-induced structural damage on the chip sections 210 of the epitaxial layer 200 is reduced.

Suppose the chip section 210 is a square having a side length of L, and suppose the spacing between neighboring chip sections 210 is 2L'. Thus, $F1 \propto L^2$, wherein F1 is the outward stress generated by one illuminated chip section 210, and $F2 \propto (L+2L')^2 - L^2$, wherein F2 is the outward stress generated by the separation zones 230 surrounding the illuminated chip section 210. When L=100 nm and 2L'=10 nm, $(F1-F2)/(F1)=(400-316)/400 \approx 20\%$. In other words, about 20% of F1 the stress generated by the illuminated chip section 210 is cancelled by F2 the outward stress generated by the separation zones 230 surrounding the illuminated chip section 210.

What is claimed is:

1. A laser lift-off method, which applies to lift off a transient substrate from an epitaxial layer grown on said transient substrate after a support substrate having an adhesion metal layer is bonded to said epitaxial layer, comprising:

said epitaxial layer is etched to define separation channels around each chip section, and said epitaxial layer between two neighboring said separation channels is not etched but preserved to form a separation zone, and each laser illumination area covers one said chip section, said separation channels surrounding said chip section, and said separation zones surrounding said chip section, wherein said separation zone has a width between 10 nm and 100 nm.

2. The laser lift-off method according to claim 1, wherein the spacing between two said chip sections is defined by two said separation channels and one said separation zone therebetween.

3. The laser lift-off method according to claim 1, wherein said separation channel has a width between 1 nm and 10 nm.

* * * * *